United States Patent
Hidaka et al.

(10) Patent No.: US 10,604,840 B2
(45) Date of Patent: Mar. 31, 2020

(54) LIQUID LEVEL INDICATOR AND LIQUID RAW MATERIAL VAPORIZATION FEEDER

(71) Applicant: FUJIKIN INCORPORATED, Osaka (JP)

(72) Inventors: Atsushi Hidaka, Osaka (JP); Masaaki Nagase, Osaka (JP); Kaoru Hirata, Osaka (JP); Satoru Yamashita, Osaka (JP); Keiji Hirao, Osaka (JP); Kouji Nishino, Osaka (JP); Nobukazu Ikeda, Osaka (JP)

(73) Assignee: FUJIKIN INCORPORATED, Osaka (JP)

( * ) Notice: Subject to any disclaimer, the term of this patent is extended or adjusted under 35 U.S.C. 154(b) by 120 days.

(21) Appl. No.: 15/525,479

(22) PCT Filed: Nov. 2, 2015

(86) PCT No.: PCT/JP2015/005498
§ 371 (c)(1),
(2) Date: May 9, 2017

(87) PCT Pub. No.: WO2016/075892
PCT Pub. Date: May 19, 2016

(65) Prior Publication Data
US 2017/0327949 A1  Nov. 16, 2017

(30) Foreign Application Priority Data
Nov. 13, 2014 (JP) .................................. 2014-231119

(51) Int. Cl.
*H01L 21/31* (2006.01)
*C23C 16/455* (2006.01)
(Continued)

(52) U.S. Cl.
CPC ........... *C23C 16/45561* (2013.01); *B01J 4/00* (2013.01); *C23C 16/448* (2013.01);
(Continued)

(58) Field of Classification Search
CPC ........ G01F 23/247; G01F 23/26; G01F 23/22; C23C 16/45561; C23C 16/448;
(Continued)

(56) References Cited

U.S. PATENT DOCUMENTS 3,181,557 A  *  5/1965  Lannan, Jr. ........... G01F 23/247
137/391
3,983,751 A  * 10/1976  Cipriano ............... G01F 23/247
73/295

(Continued)

FOREIGN PATENT DOCUMENTS

| JP | 64-46716 U | 3/1989 |
|---|---|---|
| JP | 64-46717 U | 3/1989 |

(Continued)

OTHER PUBLICATIONS

EPO translation of Hiroshi JP3009809 published Feb. 14, 2000 (Year: 2000).*

(Continued)

*Primary Examiner* — Stephen Hobson
(74) *Attorney, Agent, or Firm* — Merchant & Gould, P.C.

(57) ABSTRACT

To provide a liquid level indicator and a liquid raw material vaporization feeder, in which the time to detect a switch from the liquid phase to the gas phase has reduced flow rate dependence, and also the detection time can be shortened. The present invention includes a chamber 2 that stores a liquid raw material, at least one protection tube 3 housing a resistance temperature detector for detecting the liquid level L1 in the chamber 2, and a flow controller 4 that controls the flow rate of the gas flowing out from the chamber 2 and (Continued)

feeds the same. The protection tube 3 is horizontally inserted into a sidewall 2a of the chamber 2 and fixed thereto.

16 Claims, 10 Drawing Sheets

(51) Int. Cl.
    *B01J 4/00*     (2006.01)
    *G01F 23/24*     (2006.01)
    *C23C 16/448*     (2006.01)
    *G01F 23/26*     (2006.01)
    *H01L 21/67*     (2006.01)
    *G01F 23/22*     (2006.01)

(52) U.S. Cl.
    CPC ............ *G01F 23/247* (2013.01); *G01F 23/26* (2013.01); *H01L 21/31* (2013.01); *H01L 21/67248* (2013.01); *C23C 16/4481* (2013.01); *G01F 23/22* (2013.01)

(58) Field of Classification Search
    CPC .... C23C 16/455; B01J 4/00; H01L 21/67248; H01L 21/31
    See application file for complete search history.

(56) References Cited

U.S. PATENT DOCUMENTS

| | | | | |
|---|---|---|---|---|
| 9,357,881 B2* | 6/2016 | Gardner | ................ | G01F 23/246 |
| 9,810,566 B2* | 11/2017 | Eshchenko | ........... | G01F 23/247 |
| 2011/0100483 A1* | 5/2011 | Nagata | .................... | B01B 1/005 137/334 |
| 2012/0017675 A1* | 1/2012 | Phillips | ................. | G01F 23/242 73/292 |
| 2015/0323938 A1* | 11/2015 | Levy | ..................... | G01F 23/247 137/2 |
| 2017/0327949 A1* | 11/2017 | Hidaka | ....................... | B01J 4/00 |

FOREIGN PATENT DOCUMENTS

| | | |
|---|---|---|
| JP | 6-51834 U | 7/1994 |
| JP | 7-63592 A | 3/1995 |
| JP | 3009809 B2 | 12/1999 |
| JP | 3009809 B2 * | 2/2000 |
| JP | 2001-099692 A | 4/2001 |
| JP | 2005-337627 A | 12/2005 |
| JP | 2009-252760 A | 10/2009 |
| JP | 2010-180429 A | 8/2010 |
| JP | 2013-077710 A | 4/2013 |
| JP | 5400816 B2 | 11/2013 |
| JP | 2014-211345 A | 11/2014 |
| WO | 2009/122646 A1 | 10/2009 |
| WO | 2013/046517 A1 | 4/2013 |

OTHER PUBLICATIONS

"Passivation of Stainless Steel" in "Tech Tips" by Johnson Diversey published Apr. 2007 (Year: 2007).*

International Search Report issued in corresponding application PCT/JP2015/005498, completed Jan. 25, 2016 and dated Feb. 2, 2016.

* cited by examiner

LIQUID LEVEL INDICATOR AND LIQUID RAW MATERIAL VAPORIZATION FEEDER

This is a National Phase Application in the United States of International Patent Application No. PCT/JP2015/005498 filed Nov. 2, 2015, which claims priority on Japanese Patent Application No. 2014-231119, filed Nov. 13, 2014. The entire disclosures of the above patent applications are hereby incorporated by reference.

TECHNICAL FIELD

The present invention relates to a liquid level indicator and a liquid raw material vaporization feeder. Specifically, it relates to a liquid level indicator that detects a liquid surface level and also to a liquid raw material vaporization feeder including the liquid level indicator.

BACKGROUND ART

Conventionally, a liquid raw material vaporization feeder for feeding a raw material fluid to a semiconductor manufacturing device for metal organic chemical vapor deposition (MOCVD), for example, has been proposed (e.g., Patent Documents 1 to 3).

In a liquid raw material vaporization feeder of this type, a liquid raw material, such as TEOS (tetraethyl orthosilicate), is heated and vaporized in a vaporization chamber, and the vaporized gas is fed to a semiconductor manufacturing device at a specific flow rate controlled by a flow controller. Then, in order to compensate for the loss of the liquid raw material due to vaporization, it is necessary to detect the liquid level of the liquid raw material and perform feeding to compensate for the decrease, thereby controlling the liquid level.

As a method of detecting the liquid level of a liquid raw material, for example, a pressure-sensitive liquid level detector that monitors a pressure decrease in a vaporizer, thereby detecting a loss of the liquid raw material in the vaporizer due to vaporization (Patent Document 2, etc.) and a thermal liquid level detector that utilizes the difference in heat dissipation constant between the liquid phase and the gas phase (Patent Documents 4 to 6, etc.) are known.

In a thermal liquid level detecting device of this type, as shown in FIG. 15, two protection tubes 3, having enclosed therein resistance temperature detectors R1 and R2 made of platinum or the like, respectively, are vertically inserted into a container 21, and a relatively large constant current I1 (heating current) is passed through one resistance temperature detector R1 so that the resistance temperature detector R1 is maintained at a temperature higher than the ambient temperature by self-heating, while a small constant current I2 (current for ambient temperature measurement) that allows for ambient temperature measurement and causes negligible heating is applied to the other resistance temperature detector R2.

As a result, the resistance temperature detector R1 through which the large current I1 is passed generates heat. At this time, because the heat dissipation constant in the case where the resistance temperature detector is in the liquid phase L is larger than the heat dissipation constant in the case where it is in the gas phase V, the temperature of the resistance temperature detector in the gas phase V is higher than in the case where it is in the liquid phase.

Then, this means that a resistance temperature detector in the gas phase has a higher resistance than a resistance temperature detector in the liquid phase. Accordingly, by observing the difference between the voltage output of the resistance temperature detector R1 through which a large current is passed and the voltage output of the resistance temperature detector R2 through which a minute current is passed, it can be judged whether the resistance temperature detectors are above or below the liquid level. That is, in the case where the difference is small, the resistance temperature detectors can be judged as being below the liquid level, while in the case where the difference is large, the resistance temperature detectors can be judged as being above the liquid level.

FIG. 16 shows an example of a liquid level detection circuit. A constant current is applied to resistance temperature detectors R1 and R2 from a power supply Vcc through constant current circuits S1 and S2. The detection circuit is configured such that a current larger than in the constant current circuit S2 passes through the constant current circuit S1. That is, a small current that allows for ambient temperature measurement and causes negligible heating passes through the resistance temperature detector R2, while a relatively large current having a larger current value than in the resistance temperature detector R2 passes through the resistance temperature detector R1 so that the resistance temperature detector R1 is heated to a high temperature. The terminal voltage V1 of the resistance temperature detector R1 and the terminal voltage V2 of the resistance temperature detector R2 are input to the inverting input and noninverting input of a differential amplifier circuit D, respectively, and, from the differential amplifier circuit D, a voltage signal corresponding to the voltage difference between the terminal voltages V1 and V2 (V1−V2) is input to a comparator C. The comparator C compares the voltage difference with the reference voltage V3 determined by voltage dividing resistors R3 and R4.

When the resistance temperature detector R1 is present in the liquid phase, the temperature rise of the resistance temperature detector R1 relative to the ambient temperature is smaller than the temperature rise in the gas phase. As a result, the output voltage of the differential amplifier circuit D, which is equivalent to the difference from the voltage signal of a magnitude corresponding to the ambient temperature emitted from the resistance temperature detector R2 that is also in the liquid phase, is smaller than the reference voltage, resulting in a low-level output from the comparator C. Meanwhile, when the liquid level decreases and the resistance temperature detector R1 is exposed to the gas phase, the temperature rise relative to the ambient temperature is the temperature rise in the gas phase. Therefore, the output voltage of the differential amplifier circuit D, which is equivalent to the difference from the voltage signal of a magnitude corresponding to the ambient temperature emitted from the resistance temperature detector R2 that is also in the gas phase, is larger than the reference voltage, resulting in a high-level output from the comparator C. When the output of the comparator C is high level, it is judged that the resistance temperature detectors R1 and R2 are in the gas phase, while when the output of the comparator C is low level, it is judged that the resistance temperature detectors R1 and R2 are in the liquid phase.

When the terminal voltages V1 and V2 are determined, according to the Ohm's law, the resistances of the resistance temperature detectors R1 and R2 can be calculated from the current values I1 and I2. When the resistances of the resistance temperature detectors R1 and R2 are obtained, and the rates of change of resistance with respect to temperature of the resistance temperature detectors R1 and R2 are known, the temperatures of the resistance temperature detectors R1 and R2 can be derived. Therefore, in a liquid level detection circuit, instead of comparing the voltage outputs of the resistance temperature detectors R1 and R2, it is also possible to compare the resistances of the resistance temperature detectors R1 and R2 to perform judgement. Alternatively, utilizing the rates of change of resistance with respect to temperature of the resistance temperature detectors R1 and R2, it is also possible that the temperatures of the resistance temperature detectors R1 and R2 are measured from the respective resistances, and the temperatures are compared to perform judgement. In the case of platinum, the resistance is 100Ω at 0° C., and it increases

CITATION LIST

Patent Literature

Patent Document 1: Japanese Laid-Open Patent Publication No. 2009-252760
Patent Document 2: Japanese Laid-Open Patent Publication No. 2010-180429
Patent Document 3: Japanese Laid-Open Patent Publication No. 2013-77710
Patent Document 4: Japanese Patent No. 3009809
Patent Document 5: Japanese Patent No. 5400816
Patent Document 6: Japanese Laid-Open Patent Publication No. 2001-99692

SUMMARY OF INVENTION

Technical Problem

In the pressure-sensitive liquid level detector described above, at the time when a pressure decrease in the vaporizer is detected, there is almost no liquid raw material in the vaporizer, and the feeding of a liquid raw material in such a boil-dry situation may lead to poor flow control.

Meanwhile, in a thermal liquid level detector, a set liquid level height can be detected. Accordingly, the liquid level at a desired height is detected, and the liquid supply is controlled so as to maintain the liquid level at that height, making it possible to solve the problems of a pressure-sensitive liquid level detector described above.

However, a conventional thermal liquid level detector has been problematic in that detection takes a relatively long period of time, and thus the detection response is slow. In addition, there has also been a problem in that in the case where a conventional thermal liquid level detector is used in combination with a flow controller, the time to detect a switch from the liquid phase to the gas phase is dependent on the flow rate, and it is difficult to perform accurate detection.

A main object of the present invention is to provide a thermal liquid level indicator capable of solving the problems of a conventional thermal liquid level detector described above, and also provide a liquid raw material vaporization feeder including the liquid level indicator.

Solution to Problem

In order to achieve the above object, the liquid level indicator according to the present invention is a liquid level indicator for use in a chamber that stores a liquid, including a liquid level detection member and a temperature measurement member, the liquid level detection member being configured to include a protection tube housing a resistance temperature detector and be horizontally disposed in the chamber.

The protection tube of the liquid level detection member may be horizontally inserted into a sidewall of the chamber and fixed thereto.

The temperature measurement member may include a protection tube housing a resistance temperature detector and is horizontally disposed in the chamber.

The temperature measurement member may include a protection tube housing a thermocouple, a thermistor, or an infrared thermometer.

The temperature measurement member and the liquid level detection member may be disposed at the same horizontal level.

The liquid level indicator may be configured such that a current (heating current) having a larger current value than a current for temperature measurement is passed through the resistance temperature detector of the liquid level detection member, and the detection temperature measured by the liquid level detection member is compared with the temperature measured by the temperature measurement member, thereby detecting whether the liquid level detection member is present in a liquid phase portion or in a gas phase portion.

The liquid level indicator may be configured such that a first current for temperature measurement is passed through the resistance temperature detector of the temperature measurement member, while a second current (heating current) larger than the first current is passed through the resistance temperature detector of the liquid level detection member, and the resistances of the respective resistance temperature detectors are compared, thereby detecting whether the liquid level detection member is present in a liquid phase portion or in a gas phase portion.

The temperature measurement member may be disposed below a predetermined minimum liquid level, and the liquid level detection member is disposed at one or both of the minimum liquid level and a predetermined maximum liquid level.

The liquid level indicator according to the prevent invention may include a protection tube horizontally disposed in a chamber that stores a liquid raw material and housing a resistance temperature detector, the liquid level indicator being configured such that a current for temperature measurement having a first current value and a current (heating current) having a second current value larger than the first current value are alternately passed through the resistance temperature detector, and the resistances of the resistance temperature detector to the respective current values are compared, thereby detecting whether the protection tube is present in a liquid phase portion or in a gas phase portion.

The liquid level indicator according to the prevent invention may include a protection tube horizontally disposed in a chamber that stores a liquid and housing a resistance temperature detector, the liquid level indicator being configured such that a current (heating current) having a predetermined current value larger than that of a current for temperature measurement is passed through the resistance temperature detector, and, based on changes in resistance between when the protection tube is in a liquid phase portion and when it is in a gas phase portion, whether the protection tube is in a liquid phase portion or in a gas phase portion is detected.

The protection tube may be subjected to a passivation treatment.

In addition, the liquid raw material vaporization feeding device according to the present invention includes: a chamber that stores and vaporizes a liquid raw material; a liquid level detection member disposed in the chamber; a temperature measurement member that measures the temperature in the chamber; and a flow controller that controls the flow rate of the raw material gas vaporized in the chamber, the liquid level detection member being configured to include a protection tube housing a resistance temperature detector and be horizontally disposed in the chamber.

In the liquid raw material vaporization feeder according to the present invention, the protection tube may be horizontally inserted into a sidewall of the chamber and fixed thereto, the protection tube includes a flange for fixing to the sidewall of the chamber, and the liquid raw material vaporization feeder includes: a metal gasket interposed between the flange and the outer surface of the chamber sidewall and surrounding the perimeter of the protection tube; a recess for a gasket, formed in each of the flange and the outer surface of the chamber sidewall for receiving the metal gasket; and an annular projection for pressing a gasket, formed in each recess for a gasket.

In addition, in the liquid raw material vaporization feeder according to the present invention, the protection tube may be screw-fixed to the chamber.

In addition, in the liquid raw material vaporization feeder according to the present invention, the temperature measurement member may include a protection tube housing a resistance temperature detector or a thermocouple and is horizontally disposed in the chamber, and the liquid level detection member and the temperature measurement member are disposed at the same horizontal level.

In addition, in the liquid raw material vaporization feeder according to the present invention, a vapor barrier plate for blocking vapor rising from the liquid raw material may be provided below the protection tube. The vapor barrier plate may extend obliquely.

ADVANTAGEOUS EFFECTS OF INVENTION

In the liquid level indicator according to the present invention, because the protection tube of the liquid level detection member is horizontally disposed in a chamber, the detection time can be shortened. In addition, in the liquid raw material vaporization feeder according to the present invention, because the protection tube of the liquid level detection member is horizontally disposed in a chamber, the flow rate dependence of the time to detect a switch from the liquid phase to the gas phase can be almost eliminated.

DESCRIPTION OF EMBODIMENTS

Figure 1:
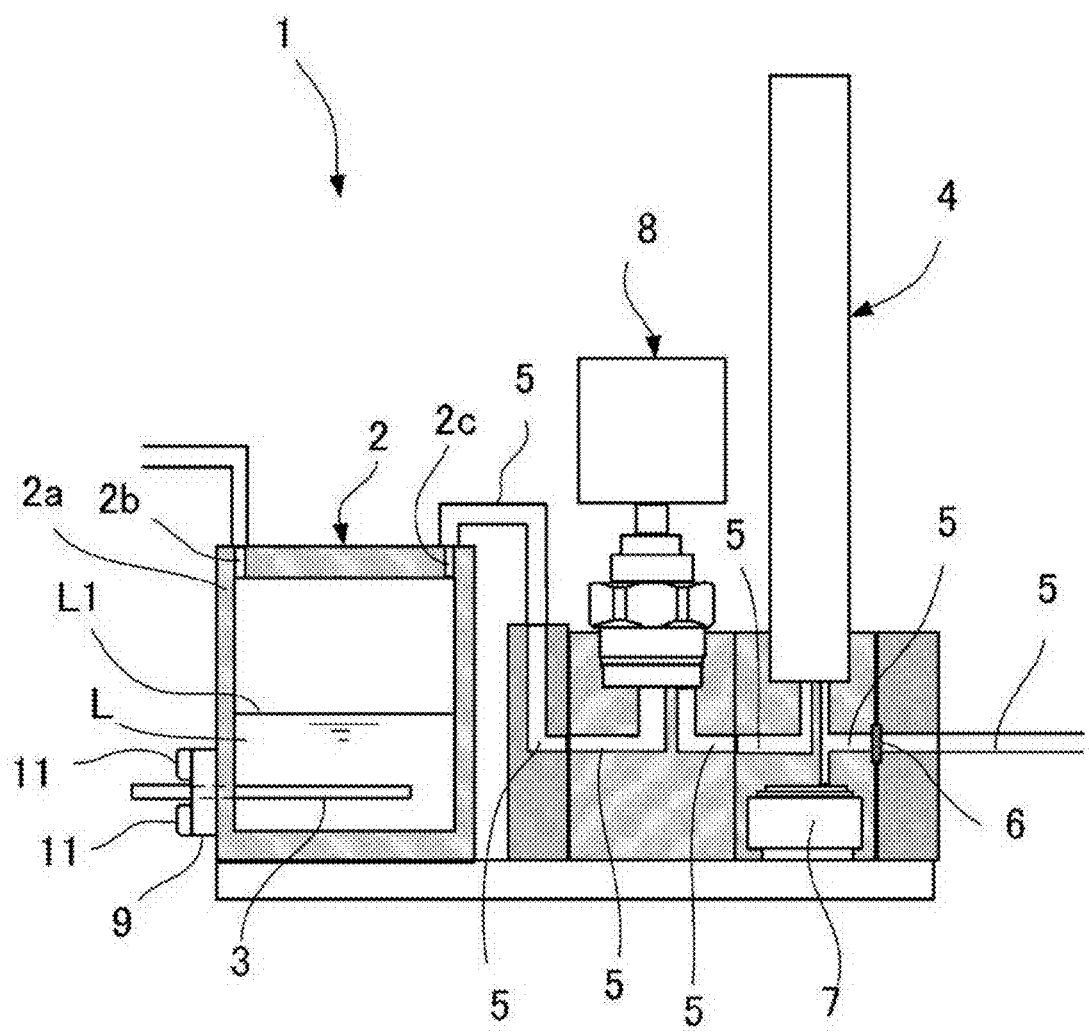
FIG. 1 A partial cross-sectional side view showing a first embodiment of the liquid raw material vaporization feeder including a liquid level indicator according to the present invention.

Hereinafter, embodiments of the liquid raw material vaporization feeder including a liquid level indicator according to the present invention will be described with reference to the drawings. Through all the figures and embodiments, the same or similar components are indicated with the same reference numeral.

Figure 2:
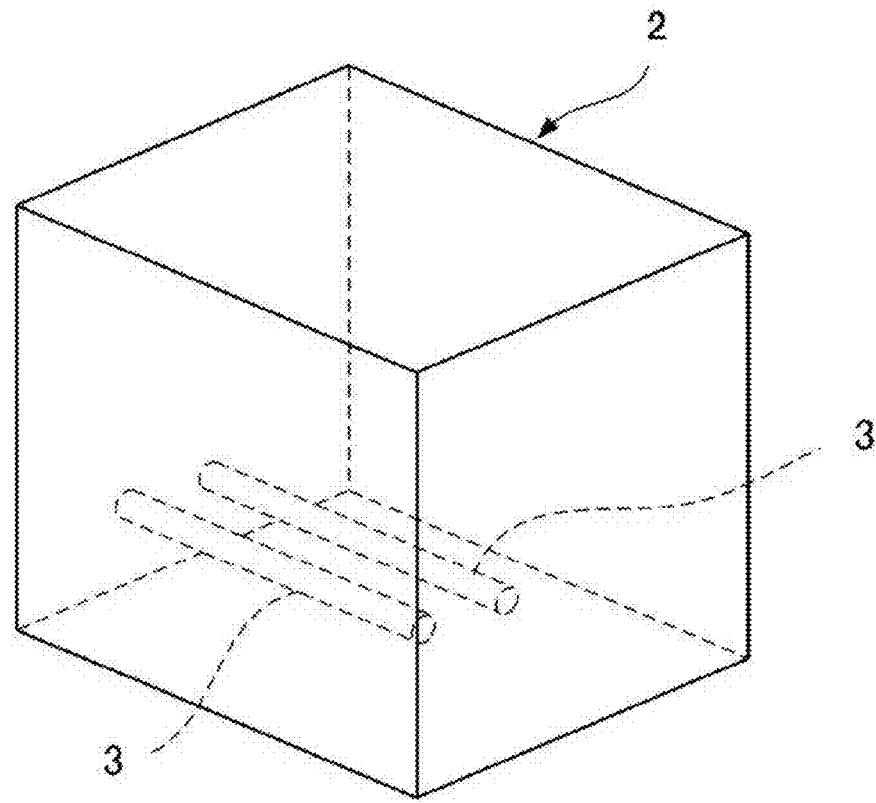
FIG. 2 A schematic perspective view of the inside of the chamber of FIG. 1.

FIG. 1 is a cross-section side view showing a first embodiment of the present invention. As shown in FIG. 1, the liquid raw material vaporization feeder 1 including a liquid level indicator according to the present invention includes a vaporization chamber 2 that stores and vaporizes a liquid raw material L, a protection tube 3 having enclosed therein a resistance temperature detector (not shown) for detecting the liquid level L1 in the vaporization chamber 2, and a flow controller 4 that controls the flow rate of the gas vaporized in the vaporization chamber 2 and feeds the same. Two protection tubes 3,3 (see FIG. 2.) are inserted into a sidewall 2a of the vaporization chamber 2 at the same horizontal level and fixed thereto.

As the resistance temperature detector enclosed in the protection tube 3, it is preferable to use a platinum resistance temperature detector, but other known resistance temperature detectors may also be used. As a liquid level detection circuit using resistance temperature detectors, a circuit having the same principles as the conventional circuit described above may be employed, and thus the detailed description will be omitted. The two protection tubes 3,3 have the same outer diameter, and each tube 3 houses a resistance temperature detector in a distal end portion of its elongated rod portion.

The protection tubes 3,3 house identical resistance temperature detectors, respectively. One protection tube 3 and the resistance temperature detector housed therein form a temperature measurement member used for ambient temperature measurement, configured such that a current for temperature measurement, that is, a minute constant current that allows for ambient temperature measurement and causes negligible self-heating of the resistance temperature detector, is passed through the resistance temperature detector. The other protection tube 3 and the resistance temperature detector housed therein form a liquid level detection member, configured such that a relatively large constant current (heating current) is passed through the resistance temperature detector so as to maintain its temperature higher than the ambient temperature by self-heating, and, through the above liquid level detection circuit, whether it is in the liquid phase or in the gas phase is determined.

The vaporization chamber 2 has a box shape having, on its top, a feed port 2b for a liquid raw material and a discharge port 2c for a vaporized gas, and is made of a metal such as stainless steel. The feed port for a liquid raw material is not limited to the illustrated example. It is also possible that a feed pipe is inserted into the upper wall of the vaporization chamber 2, and the lower end of the feed pipe is extended to an inner lower portion of the vaporization chamber 2, thereby providing a feed port in the inner lower portion of the vaporization chamber 2. Alternatively, the feed port may also be provided in the sidewall of the vaporization chamber 2 or the bottom wall of the vaporization chamber 2.

The vaporization chamber may be heated by a heater (not shown) attached surrounding the outer surface of the chamber wall. Although not shown, it is also possible that a recess or a hole is formed in the metal wall forming the vaporization chamber 2, and the heater that heats the vaporization chamber 2 is embedded therein.

Although the vaporization chamber 2 is formed of a single chamber in the illustrated example, it is also possible that a chamber is partitioned into a plurality of chambers with a partitioning wall (not shown), and a hole for passing the vaporized gas is formed in each partitioning wall. In this case, a feed port for feeding a liquid raw material is provided in the partitioned chamber on one end side, and a discharge port for discharging a vaporized gas is provided in the partitioned chamber on the other end side.

The discharge port 2c is connected to communicate with a gas channel 5. The gas channel 5 is formed of a pipe or a hole formed in the block. In the gas channel 5, a flow controller 4 is interposed. As the flow controller 4 of the illustrated example, a known, so-called pressure-type flow controller may be employed, wherein the gas pressure on at least the upstream side of an orifice plate 6 interposed in the gas channel 5 is detected by a pressure detector 7, and, based on the detected pressure signal, a metal diaphragm valve element interposed in the gas channel 5 is opened/closed by a piezoelectric driving element, thereby controlling the flow rate. That is, when the absolute pressure on the upstream side of the orifice plate 6 becomes about twice or more the absolute pressure on the downstream side of the orifice plate 6 (critical expansion condition), the gas passing through the orifice reaches, but does not exceed, the sonic speed. Accordingly the flow rate is dependent only on the pressure on the orifice upstream side, and the flow rate is proportional to the pressure; this principle is utilized. Although not shown, it is also possible that the pressure on the orifice downstream side is detected, the flow rate is controlled based on the difference in pressure between the upstream side and the downstream side of the orifice.

In the gas channel 5, a pneumatically driven on/off valve 8 is interposed. Although the on/off valve 8 is interposed in the gas channel 5 between the vaporization chamber 2 and the flow controller 4, it may also be provided in the gas channel on the downstream side of the flow controller 4 or may alternatively be omitted.

The protection tube 3 is made of a corrosion-resistant metal material, such as stainless steel, and houses a resistance temperature detector in a distal end portion of its elongated sheath portion 3a. A passivation film of stainless steel is relatively thin, and thus it is preferable to further subject the protection tube 3 to a passivation treatment to enhance the corrosion resistance.

Because the protection tube 3 is horizontally inserted into the vaporization chamber 2, it is necessary to fix the protection tube 3 with a sealing structure that prevents the leakage of the high-temperature liquid raw material from the vaporization chamber 2.

Figure 3:
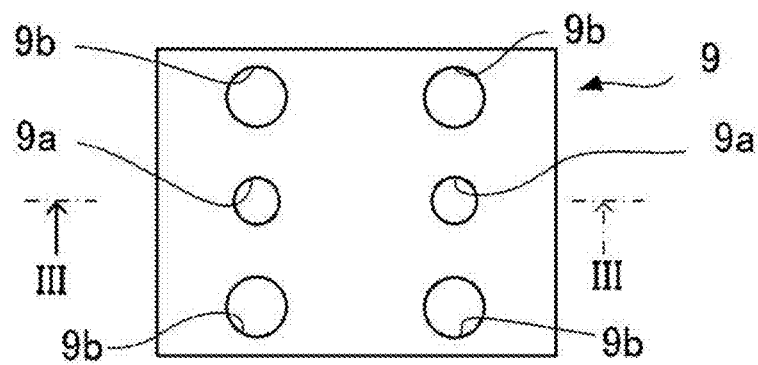
FIG. 3 An expanded plan view of a flange fixed to the protection tube shown in FIG. 1.
Figure 4:
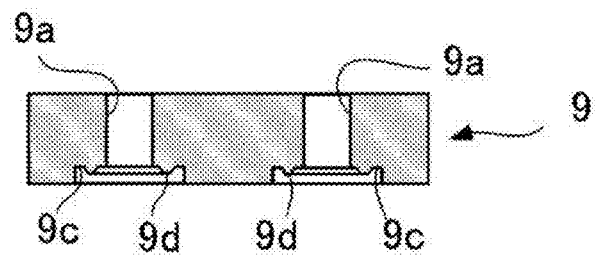
FIG. 4 A cross-sectional view along the line of FIG. 3.
Figure 5:
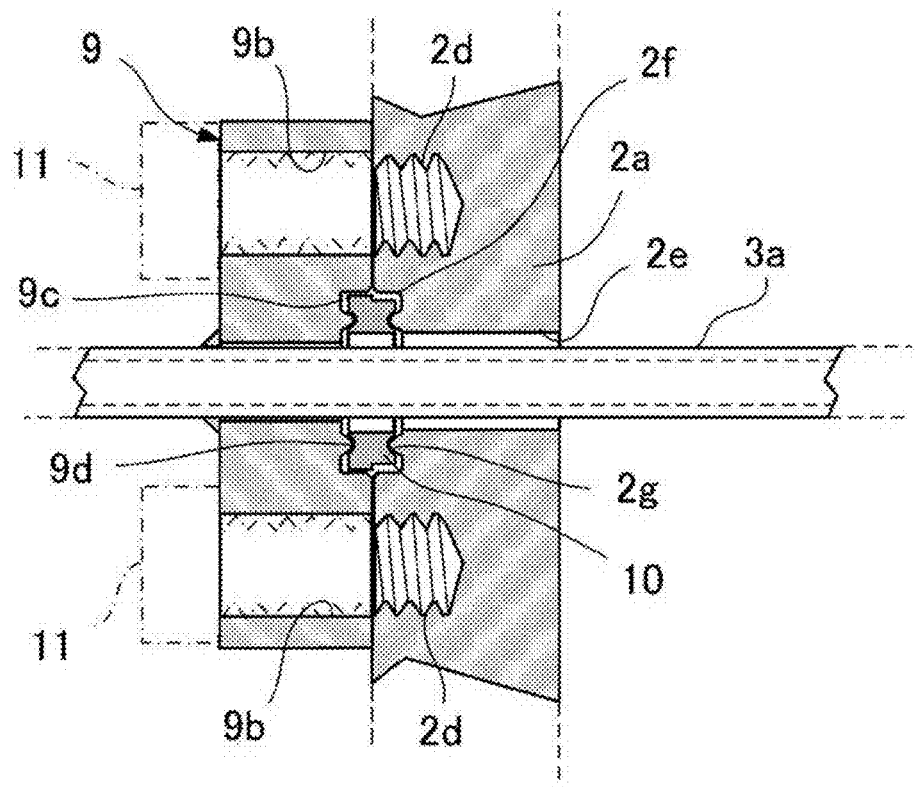
FIG. 5 An enlarged, essential part longitudinal cross-sectional view of the fixing structure for the protection tube shown in FIG. 1.

With reference to FIG. 3 to FIG. 5, the protection tube 3 is fitted into a hole 9a formed in the flange 9 also made of stainless steel and fixed to the fixing flange 9 by welding. The fixing flange 9 includes, in addition to the hole 9a, a plurality of bolt holes 9b and a first recess for a gasket 9c formed around the hole 9a on one side surface of the fixing flange 9. The first recess for a gasket 9c has formed thereon a first annular projection for pressing a gasket 9d.

The vaporization chamber 2 includes, on one side surface, a bottomed female screw hole 2d that agrees with the bolt hole 9b of the fixing flange 9, a through-hole 2e that passes the protection tube 3, and a second recess for a gasket 2f formed on the perimeter of the through-hole 2e on the outer side surface of the vaporization chamber 2. The second recess for a gasket 2f has formed thereon a second annular projection for a gasket presser 2g.

The protection tube 3 is passed through the annular metal gasket 10 and the through-hole 2e of the vaporization chamber 2, and the male screw 11 passed through the bolt hole 9b of the fixing flange 9 is screwed into the female screw hole 2d of the vaporization chamber 2. As a result, the first annular projection for pressing a gasket 9d and the second annular projection for pressing a gasket 2g dig into both side surfaces of the metal gasket 10, whereby the through-hole 2e of the vaporization chamber 2 is hermetically sealed. The metal gasket 10 may be made of stainless steel.

Figure 15:
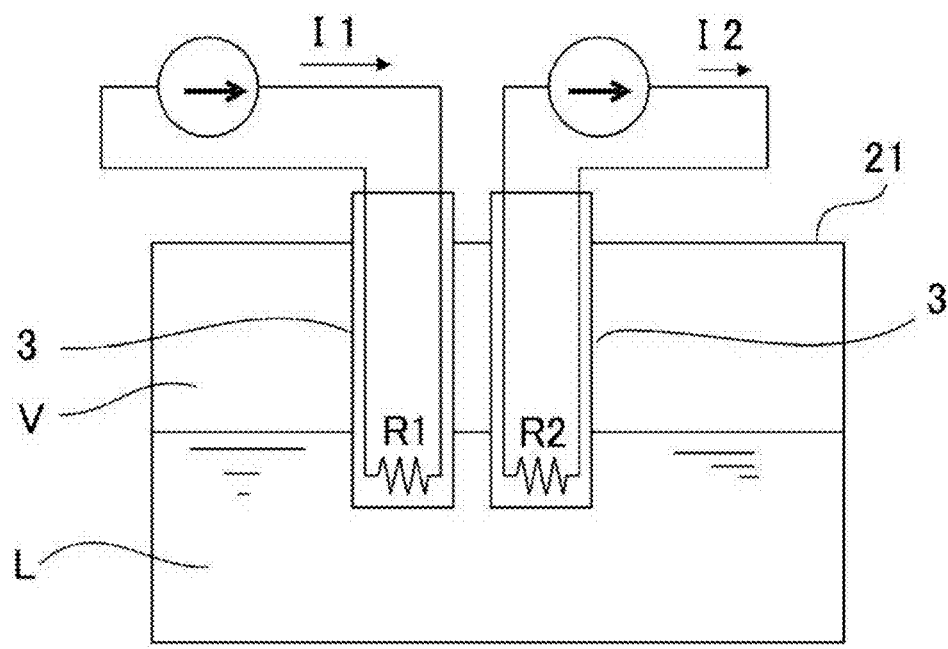
FIG. 15 A schematic configuration diagram showing a conventional liquid level indicator.
Figure 16:
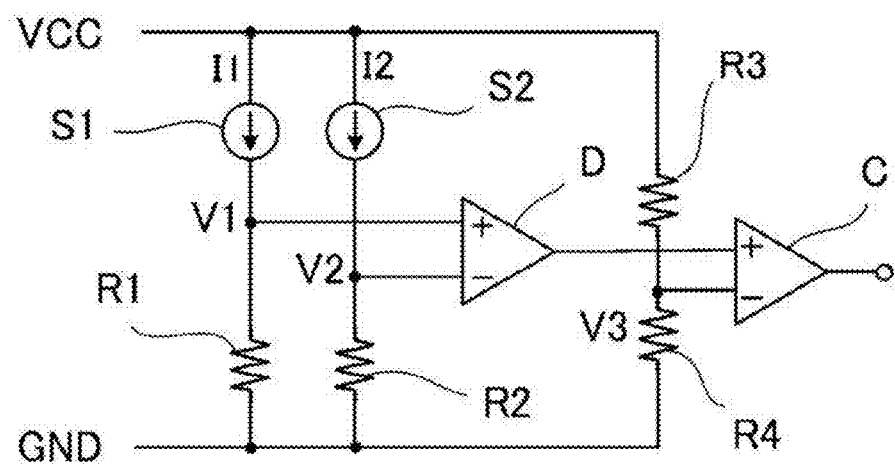
FIG. 16 A circuit diagram showing an example of a liquid level detection circuit of a conventional liquid level indicator.

Through examples of liquid raw material vaporization feeders including a liquid level indicator according to the present invention and comparative examples of liquid raw material vaporization feeders including a conventional liquid level indicator (see FIG. 15), in which a protection tube housing a platinum resistor is vertically (longitudinally) inserted into the vaporizer, the detectability of a change from the liquid phase to the gas phase was evaluated.

Figure 6:
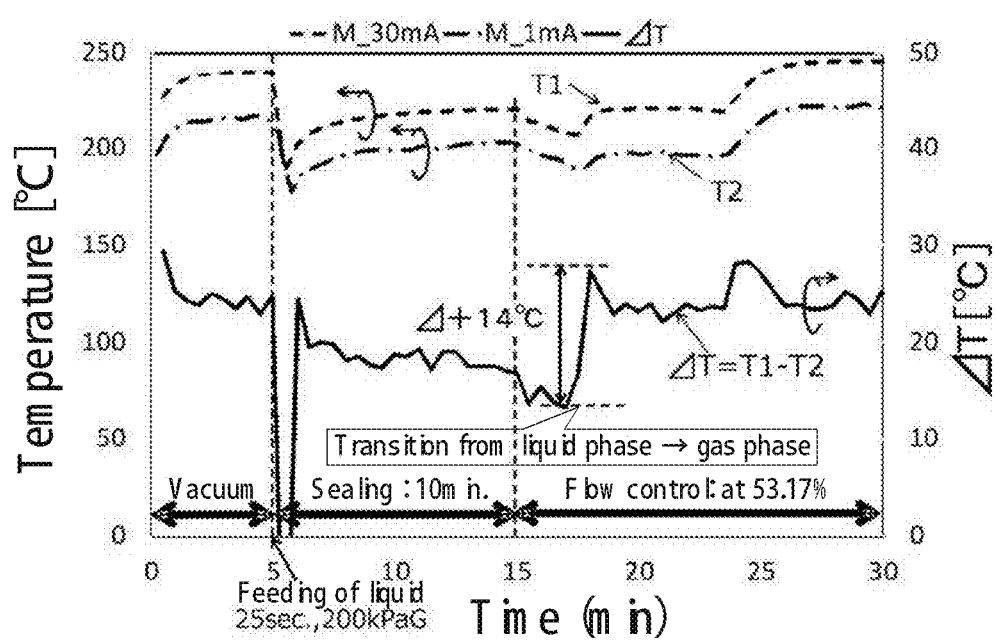
FIG. 6 A graph showing the evaluation test results of Example 1 of the present invention.
Figure 7:
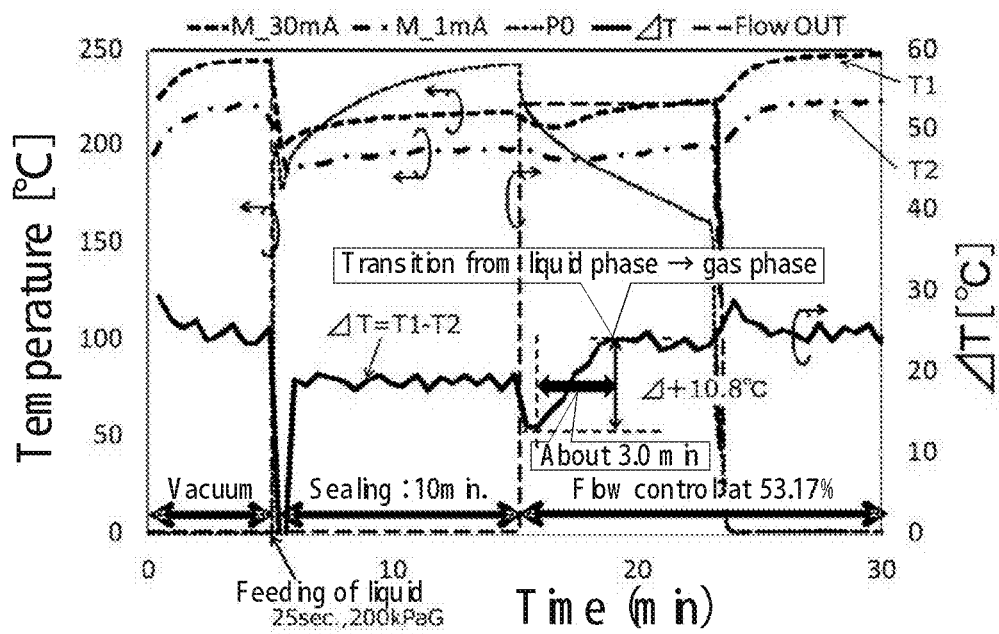
FIG. 7 A graph showing the evaluation test results of Comparative Example 1.

FIG. 6 shows the results of Example 1, and FIG. 7 shows the result of Comparative Example 1. In both Example 1 and Comparative Example 1, a constant current of 1 mA was passed through one platinum resistance temperature detector, and a constant current of 30 mA was passed through the other platinum resistance temperature detector. As the platinum resistors, those having temperature characteristics of 100Ω at 0° C. and 0.39Ω/° C. (e.g., 103.9Ω at 10° C.) were used. The evaluation conditions of the evaluation test were as follows. Using TEOS as a liquid raw material, the vaporization chamber 2 was set at a temperature of 200° C. and a controlled gas flow rate of 53.17% (6.7 g/min), and the inside of the vaporization chamber was evacuated to a vacuum, followed by feeding the liquid raw material until the protection tubes were submerged. The valve of the flow controller and also the valve interposed in the liquid raw material feed pipe of the vaporization chamber were closed, and, after sealing for minutes, the flow controller was operated to flow the vaporized gas at a specific flow rate.

In FIG. 6 and FIG. 7, the line T1 is a graph showing changes over time in the temperature of the platinum resistance temperature detector through which 30 mA was passed, and the line T2 is a graph showing changes over time in the temperature of the platinum resistance temperature detector through which 1 mA was passed. The temperature of each platinum resistance temperature detector was computed by calculation from the temperature characteristics of the platinum resistance temperature detector. In FIG. 6 and FIG. 7, the region where $\Delta T=T1-T2$ is large indicates the transition from the gas phase to the liquid phase.

As shown in FIG. 6 and FIG. 7, in Example 1 shown in FIG. 6, the transition from the gas phase to the liquid phase was detected within 30 seconds, but in Comparative Example 1 of FIG. 7, detection took about 3 minutes. The reason why the detection time in Comparative Example 1 is longer than in Example 1 is likely to be as follows. In Example 1, during the vaporization of the liquid raw material and the resulting transition from the gas phase to the liquid phase, because the protection tubes are horizontally installed, they are submerged over the entire length. In contrast, in the comparative example, with reference to FIG. 15, because the protection tubes are longitudinally installed, they are gradually exposed from the liquid phase. Accordingly, heat dissipation to the liquid decreases, resulting in increased self-heating.

Figure 8:
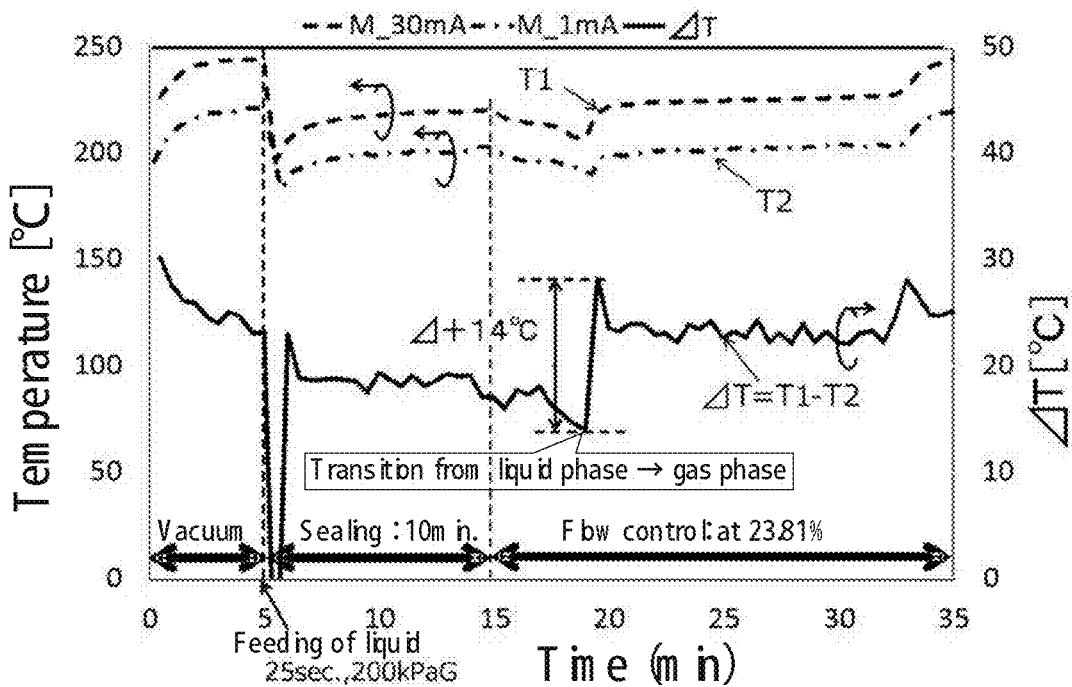
FIG. 8 A graph showing the evaluation test results of Example 2 of the present invention.
Figure 9:
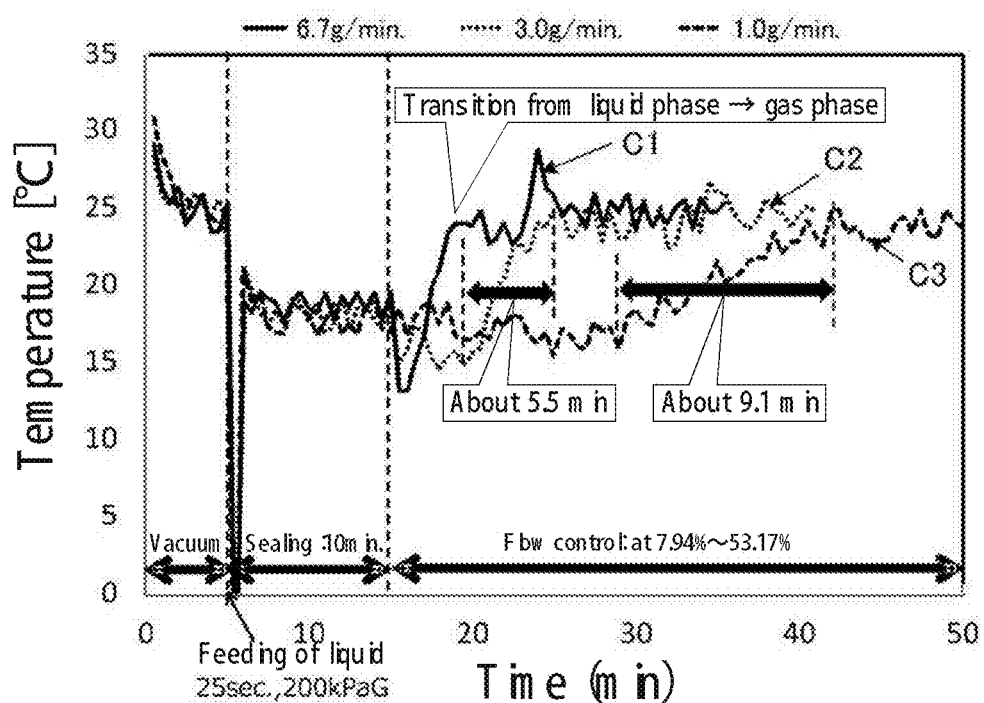
FIG. 9 A graph showing the evaluation test results of Comparative Examples 1 to 3.

Next, the same evaluation test as in Example 1 was performed in Example 2, where the controlled flow rate was set lower than in Example 1, and also in Comparative Example 2 and Comparative Example 3, where the controlled flow rate was lower than in Comparative Example 1. The results are shown in FIG. 8 and FIG. 9. FIG. 8 corresponds to Example 2. In Example 2, the controlled flow rate was set at 3.0 g/min. FIG. 9 shows $\Delta T=T1-T2$ of Comparative Examples 1, 2, and 3, where the line C1, line C2, and line C3 show Comparative Example 1, Comparative Example 2, and Comparative Example 3, respectively. The controlled flow rate in Comparative Example 1 was 6.7 g/min, the controlled flow rate in Comparative Example 2 was 3.0 g/min, and the controlled flow rate in Comparative Example 3 was 1.0 g/min.

Comparing FIG. 8 and FIG. 9, between Example 1 and Example 2, even when the controlled flow rate was changed from 6.7 g/min to 3.0 g/min, no significant difference was observed in the time to detect a change from the liquid phase to the gas phase. However, in Comparative Examples 1 to 3, the time to detect a change from the liquid phase to the gas phase increased with a decrease in the controlled flow rate, and the detection time was about 3 minutes in Comparative Example 1, about 5.5 minutes in Comparative Example 2, and about 9.1 minutes in Comparative Example 3. With respect to the time to detect a change from the liquid phase to the gas phase, such a difference between the examples and the comparative examples is likely to be attributable to the difference in the time taken for the protection tube to change from the submerged state to the exposed state.

In the first embodiment described above, two resistance temperature detectors are used, and the current passing through one resistance temperature detector is made larger than the current passing through the other resistance temperature detector, whereby the transition of the liquid level from the liquid phase to the gas phase (or from the gas phase to the liquid phase) is detected. However, it is also possible that only one resistance temperature detector is provided, and large and small currents of predetermined magnitudes (a current for temperature measurement and a heating current) are alternately passed through the resistance temperature detector every predetermined period of time (e.g., every 10 to 15 seconds), whereby the transition of the liquid level from the liquid phase to the gas phase (or from the gas phase to the liquid phase) is detected.

Figure 10:
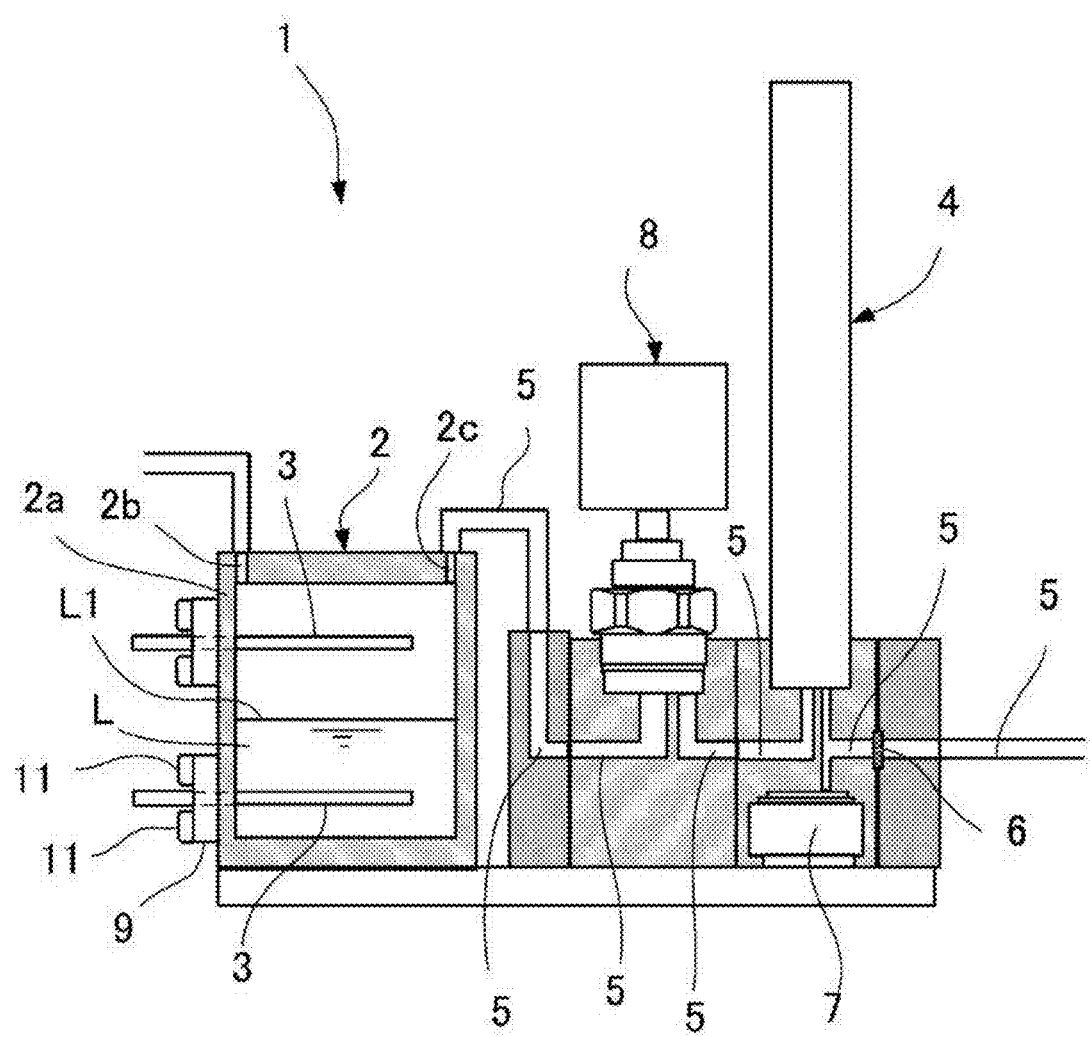
FIG. 10 A partial cross-sectional side view showing a second embodiment of the liquid raw material vaporization feeder including a liquid level indicator according to the present invention.
Figure 11:
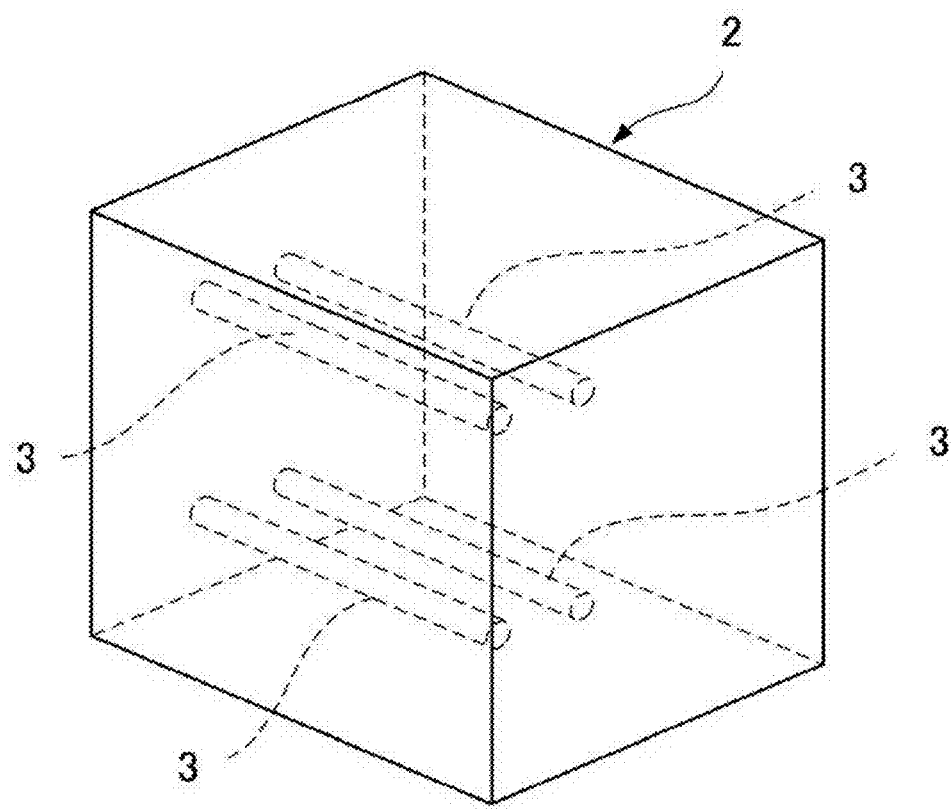
FIG. 11 A schematic perspective view of the inside of the chamber shown in FIG. 10.

FIG. 10 is a partial cross-sectional side view showing a second embodiment of the liquid raw material vaporization feeder including a liquid level indicator according to the present invention. In the second embodiment, protection tubes 3 each housing a resistance temperature detector are attached in two levels to the vaporization chamber 2. With reference to FIG. 11, the attachment of the protection tubes 3 each housing a resistance temperature detector is such that two protection tubes 3 (a liquid level detection member and a temperature measurement member) are attached at the same height of the upper level, while two protection tubes 3 (a liquid level detection member and a temperature measurement member) are also attached at the same height of the lower level. By providing a pair of protection tubes in two levels, the maximum liquid level and the minimum liquid level of a liquid raw material in the vaporization chamber 2 can be determined. The protection tube containing a resistance temperature detector forming the upper-level temperature measurement member may also be omitted. In this case, the maximum liquid level can be detected by the lower-level temperature measurement member and the upper-level liquid level detection member.

Figure 12:
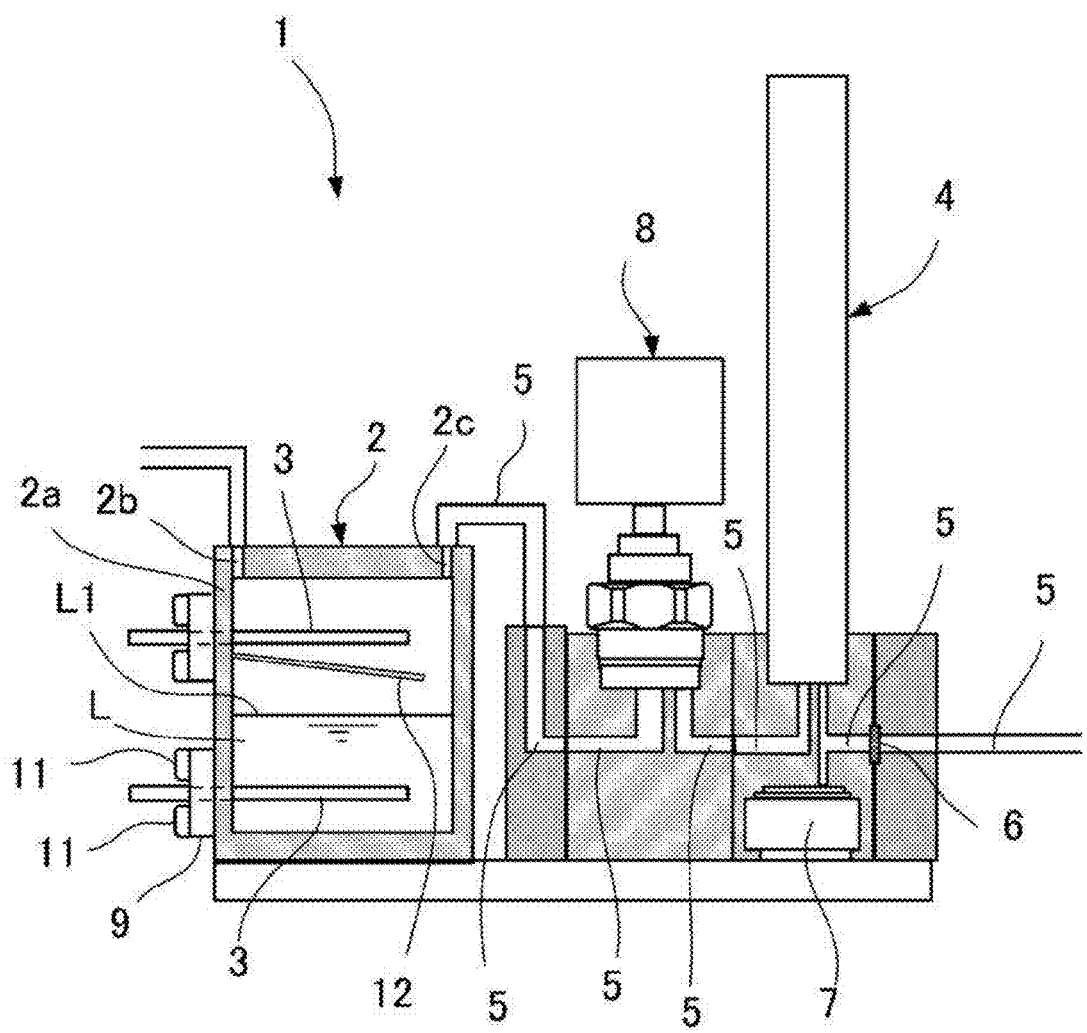
FIG. 12 A partial cross-sectional side view showing a third embodiment of the liquid raw material vaporization feeder including a liquid level indicator according to the present invention.
Figure 13:
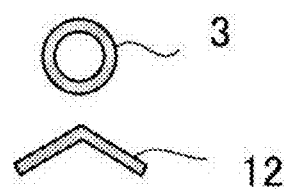
FIG. 13 Longitudinal cross-sectional views of a protection tube and a vapor barrier plate, showing a variation of the third embodiment of FIG. 12.
Figure 14:
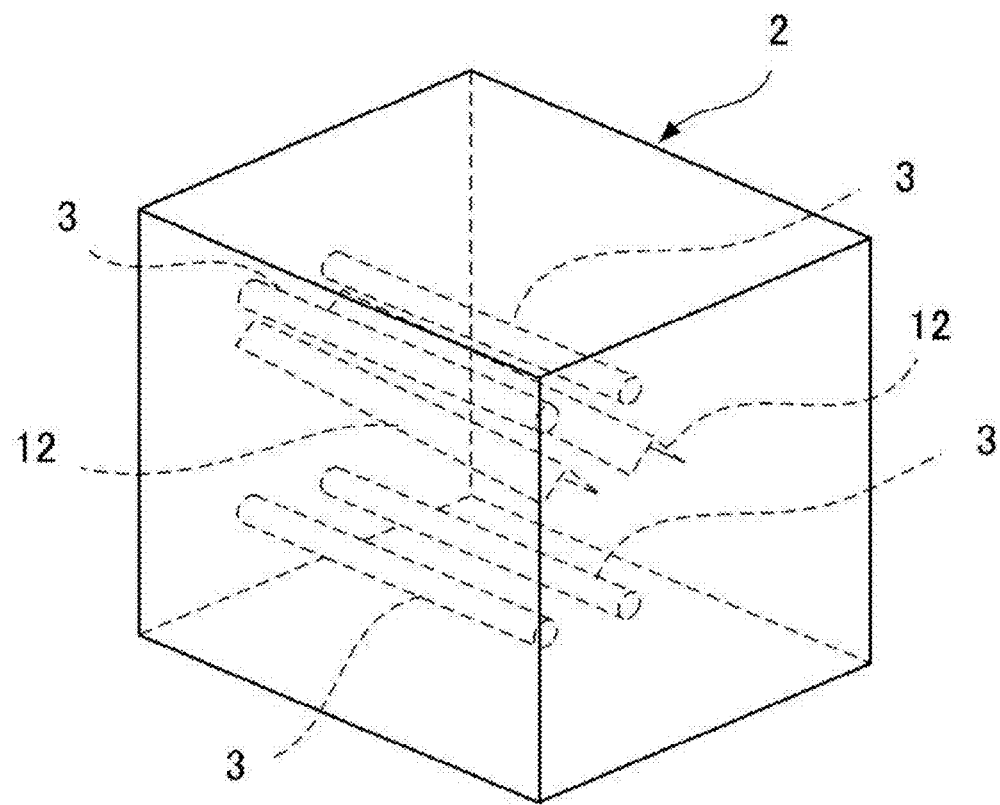
FIG. 14 A schematic perspective view of the inside of the chamber shown in FIG. 12.

FIG. 12 is a partial cross-sectional side view showing a third embodiment of the liquid raw material vaporization feeder including a liquid level indicator according to the present invention. In the third embodiment, a vapor barrier plate 13 for blocking vapor rising from the liquid raw material is provided below the protection tube 3. It is preferable that the vapor barrier plate 12 is arranged to extend obliquely downward or upward (downward in the illustrated example below) from the proximal portion to the distal end portion. The vapor barrier plate 12 may be in the form of a flat plate, or may also be in the form of a plate having an angle cross-section as shown in FIG. 13 and FIG. 14. By providing a vapor barrier plate 12, malfunctioning due to vapor of the liquid raw material can be reduced. The width dimension and length of the vapor barrier plate 12 can be suitably designed, but it is preferable that the width dimension is 1.5 to 2 times the outer diameter of the protection tube 3, and the length dimension is about 1 to 1.3 times the length of the protection tube 3.

In the above embodiments, examples in which a resistance temperature detector is housed in the protection tube 3 of a temperature measurement member have been described. However, as long as the temperature measurement member can measure the ambient temperature, in place of resistance temperature detectors, other temperature sensors, such as thermocouples, thermistors, and infrared thermometers, may be housed in the protection tubes.

In addition, in the above embodiments, examples in which the protection tube of a temperature measurement member and the protection tube of a liquid level detection member are disposed at the same horizontal level have been shown. However, the configuration may also be such that the protection tube of a temperature measurement member is disposed below a predetermined minimum liquid level so as to be submerged all the time, and the protection tube of a liquid level detection member is disposed at the minimum liquid level and/or a maximum liquid level.

In addition, the attachment of protection tubes to the chamber is not limited to the above embodiments. For example, it is possible that a screw hole is formed in the wall of the chamber, while a male screw is formed on the outer periphery of the protection tube, and the protection tube is screwed into and thus fixed to the chamber.

In addition, in the above embodiments, an example of a hermetically sealed vaporization chamber has been described. However, a chamber having an open top is also usable.

In addition, the liquid level to be detected is not limited to that of a liquid raw material used in a semiconductor manufacturing device, and the present invention is also applicable to various liquid chemicals and the like.

REFERENCE SIGNS LIST

1: Liquid raw material vaporization feeder
2: Vaporization chamber
3: Protection tube
4: Flow controller
L: Liquid raw material
L1: Liquid level
9: Flange
10: Metal gasket
9c, 2f: Recess for gasket
9d, 2g: Annular projection for pressing gasket
12: Vapor barrier plate

The invention claimed is:

1. A liquid level indicator assembly, comprising:
a chamber that stores a liquid; a liquid level detector and a temperature detector,
  wherein the liquid level detector is configured to include a protection tube housing a resistance temperature detector and be horizontally disposed in the chamber,
  the protection tube is horizontally inserted through a through-hole provided in a sidewall of the chamber and fixed thereto,
  the protection tube includes a flange for fixing to the sidewall of the chamber, and
  the liquid level indicator assembly further including,
    (a) a metal gasket interposed between the flange and the outer surface of the sidewall of the chamber and surrounding a perimeter of the protection tube, and
    (b) recesses for a gasket, each formed in each of the flange and the outer surface of the sidewall of the chamber for receiving the metal gasket.

2. The liquid level indicator assembly according to claim 1, wherein the temperature detector includes a protection tube housing a resistance temperature detector and is horizontally disposed in the chamber.

3. The liquid level indicator assembly according to claim 2, wherein the protection tube of the liquid level detector and the protection tube of the temperature detector are integrated by attaching the protection tube of the temperature detector to the flange provided on the protection tube of the liquid level detector.

4. The liquid level indicator assembly according to claim 2, wherein the temperature detector and the liquid level detector are disposed at the same horizontal level.

5. The liquid level indicator assembly according to claim 2, configured such that a first current for temperature measurement is passed through the resistance temperature detector of the temperature detector, while a second current larger than the first current is passed through the resistance temperature detector of the liquid level detector, and resistance values of the respective resistance temperature detectors are compared, thereby detecting whether the liquid level detector is present in a liquid phase portion or in a gas phase portion.

6. The liquid level indicator assembly according to claim 5, wherein the temperature detector is disposed below a predetermined minimum liquid level, and the liquid level detector is disposed at the minimum liquid level or a predetermined maximum liquid level.

7. The liquid level indicator assembly according to claim 1, wherein the temperature detector includes one of the elements selected from the group consisting of a thermocouple, a thermistor, and an infrared thermometer.

8. The liquid level indicator assembly according to claim 1, configured such that a current having a larger current value than a current for temperature measurement is passed through the resistance temperature detector of the liquid level detector to measure a detection temperature, and the detection temperature measured by the liquid level detector is compared with a temperature measured by the temperature detector, thereby detecting whether the liquid level detector is present in a liquid phase portion or in a gas phase portion.

9. The liquid level indicator assembly according to claim 1, wherein the protection tube has been subjected to a passivation treatment.

10. The liquid level indicator assembly according to claim 1 further includes annular projections for pressing a gasket, formed in each of the recesses for a gasket.

11. A liquid raw material vaporization feeder comprising:
a chamber that stores and vaporizes a liquid raw material;
a liquid level detector disposed in the chamber;
a temperature detector that measures the temperature in the chamber; and
a flow controller that controls a flow rate of the raw material gas vaporized in the chamber,
  wherein the liquid level detector is configured to include a protection tube housing a resistance temperature detector and be horizontally disposed in the chamber,
  wherein the protection tube is horizontally inserted through a through-hole provided in a sidewall of the chamber and fixed thereto,
  the protection tube includes a flange for fixing to the sidewall of the chamber, and
  the liquid raw material vaporization feeder further including,
    (a) a metal gasket interposed between the flange and the outer surface of the sidewall of the chamber and surrounding a perimeter of the protection tube, and
    (b) recesses for a gasket, each formed in each of the flange and the outer surface of the sidewall of the chamber for receiving the metal gasket.

12. The liquid raw material vaporization feeder according to claim 11 further includes
annular projections for pressing a gasket, formed in each of the recesses for a gasket.

13. The liquid raw material vaporization feeder according to claim 11, wherein
the temperature detector includes a protection tube housing a resistance temperature detector or a thermocouple and is horizontally disposed in the chamber, and
the liquid level detector and the temperature detector are disposed at the same horizontal level.

14. The liquid raw material vaporization feeder according to claim 13, wherein the protection tube of the liquid level detector and the protection tube of the temperature detector are integrated by attaching the protection tube of the temperature detector to the flange provided on the protection tube of the liquid level detector.

15. The liquid raw material vaporization feeder according to claim 11, wherein a vapor barrier plate for blocking vapor rising from the liquid raw material is provided below the protection tube.

16. The liquid raw material vaporization feeder according to claim 15, wherein the vapor barrier plate extends obliquely.

* * * * *